(12) United States Patent
Yamanouchi et al.

(10) Patent No.: US 8,594,589 B2
(45) Date of Patent: Nov. 26, 2013

(54) POWER AMPLIFIER, POWER AMPLIFICATION METHOD, AND STORAGE MEDIUM

(75) Inventors: Shingo Yamanouchi, Tokyo (JP); Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 90 days.

(21) Appl. No.: 13/387,707

(22) PCT Filed: Apr. 23, 2010

(86) PCT No.: PCT/JP2010/057233
§ 371 (c)(1),
(2), (4) Date: Jan. 27, 2012

(87) PCT Pub. No.: WO2011/013420
PCT Pub. Date: Feb. 3, 2011

(65) Prior Publication Data
US 2012/0126893 A1   May 24, 2012

(30) Foreign Application Priority Data

Jul. 31, 2009   (JP) ................. 2009-178849

(51) Int. Cl.
*H03C 1/62*   (2006.01)
*H04B 17/00*   (2006.01)
*H04B 1/04*   (2006.01)
*H01Q 11/12*   (2006.01)

(52) U.S. Cl.
USPC .......... 455/91; 455/102; 455/108; 455/115.1; 455/125; 455/127.1; 375/295

(58) Field of Classification Search
USPC ............... 455/91, 102, 108, 110, 115.1, 116, 455/125–127.5; 375/259, 297, 300, 302
See application file for complete search history.

(56) References Cited

U.S. PATENT DOCUMENTS 5,905,407 A   5/1999   Midya
6,300,826 B1   10/2001   Mathe et al.
(Continued)

FOREIGN PATENT DOCUMENTS

JP   2002-252524 A   9/2002
JP   2003-533116 A   11/2003
(Continued)

OTHER PUBLICATIONS

International Search Report in PCT/JP2010/057233 dated Jul. 20, 2010 (English Translation Thereof).

*Primary Examiner* — Simon Nguyen
(74) *Attorney, Agent, or Firm* — McGinn IP Law Group, PLLC

(57) ABSTRACT

This invention provides a power amplifier (100) including a signal source control unit (110) which generates and outputs an amplitude signal serving as the amplitude modulated component of an input signal and a pulse modulated signal based on the amplitude signal, and outputs a transmission signal obtained by superposing the input signal on a carrier, a delay adjustment unit (120) which synchronizes the amplitude signal, pulse modulated signal, and transmission signal with each other, a voltage signal generation unit (130) which outputs a voltage signal corresponding to the amplitude signal synchronized with the transmission signal, a current signal generation unit (140) which outputs a current signal corresponding to the pulse modulated signal synchronized with the transmission signal, and a transmission signal amplification unit (150) which amplifies the transmission signal, and outputs a transmission signal obtained by modulating the amplitude of the amplified transmission signal based on a modulated power supply signal generated by synchronizing the voltage signal and the current signal. The power amplifier can ensure the precision of the transmission signal, reduce the power consumption by using a compact, low-cost circuit arrangement, and increase the power efficiency more than the conventional one.

17 Claims, 8 Drawing Sheets

(56) References Cited

U.S. PATENT DOCUMENTS

| | | |
|---|---|---|
| 6,710,646 B1 | 3/2004 | Kimball |
| 7,109,897 B1 * | 9/2006 | Levesque ......................... 341/67 |
| 7,379,715 B2 * | 5/2008 | Udagawa et al. ............. 455/126 |
| 7,450,916 B1 * | 11/2008 | Hietala et al. ............... 455/127.2 |
| 8,126,409 B2 * | 2/2012 | Osman et al. ................. 455/102 |
| 8,131,233 B2 * | 3/2012 | Lee et al. ................... 455/114.3 |
| 2002/0008574 A1 | 1/2002 | Mathe et al. |
| 2002/0084811 A1 | 7/2002 | Casier et al. |
| 2003/0137344 A1 | 7/2003 | Kimball et al. |
| 2006/0028271 A1 | 2/2006 | Wilson |
| 2006/0057976 A1 * | 3/2006 | Klemmer ...................... 455/102 |
| 2006/0264186 A1 * | 11/2006 | Akizuki et al. ................ 455/108 |
| 2008/0026706 A1 * | 1/2008 | Shimizu et al. ............... 455/108 |
| 2008/0258831 A1 | 10/2008 | Kunihiro et al. |
| 2009/0128236 A1 | 5/2009 | Wilson |
| 2009/0274244 A1 * | 11/2009 | Jensen ......................... 375/295 |
| 2009/0296855 A1 * | 12/2009 | Kitamura et al. ............. 375/297 |
| 2010/0109769 A1 | 5/2010 | Yamanouchi |
| 2010/0291885 A1 * | 11/2010 | Shimizu et al. ............... 455/102 |

FOREIGN PATENT DOCUMENTS

| | | |
|---|---|---|
| JP | 2006-514472 A | 4/2006 |
| JP | 2006-203456 A | 8/2006 |
| JP | 2007-215158 A | 8/2007 |
| JP | 2008-022513 A | 1/2008 |
| WO | WO 2008/090712 A1 | 7/2008 |
| WO | WO 2008/105073 A1 | 9/2008 |

* cited by examiner

POWER AMPLIFIER, POWER AMPLIFICATION METHOD, AND STORAGE MEDIUM

TECHNICAL FIELD

The present invention relates to a power amplifier, power amplification method, and storage medium and, more particularly, to a power amplifier and power amplification method for amplifying a transmission radio signal used in a wireless communication device, and a storage medium.

BACKGROUND ART

Conventionally, a power amplifier (PA) for amplifying power of a transmission radio signal used in a wireless communication device consumes a large amount of power among the building elements of the wireless communication device. Improving the PA power efficiency is therefore considered to be important.

In recent wireless communication, amplitude modulation is dominant for a higher spectral efficiency of radio signals for use. A typical example is QAM (Quadrature Amplitude Modulation) which is a modulation scheme in digital wireless communication.

In this modulation scheme, the PA requires high linearity with less distortion to prevent degradation of a transmission signal and the influence on an adjacent channel. Conventionally, a PA used in an amplitude modulation wireless communication device operates in, a large backoff (low input power) state which improves the linearity, achieving a low distortion characteristic.

However, when the PA operates in a large backoff state, that is, in a power region lower than the saturation power of the PA, the PA power efficiency decreases.

To solve a challenge to the PA characteristic to achieve both high power efficiency and linearity, "polar modulation" have extensively been studied as a technique for improving the power efficiency in a large backoff (low input power) state. PAs having satisfactory linearity and high power efficiency using polar modulation have been developed.

FIG. 11 is a block diagram showing an outline of a power amplifier based on an ET (Envelope Tracking) scheme which is a kind of conventional polar modulation. FIG. 12 is a block diagram showing an outline of a power amplifier based on an EER (Envelope Elimination and Restoration) scheme. The arrangement and operation of the power amplifier using the polar modulation technique will be explained.

An ET power amplifier 10 shown in FIG. 11 includes a polar modulator 11, power supply modulator 12, and RF (Radio Frequency) amplifier 13. The power amplifier 10 implements power amplification of an input transmission signal.

Upon receiving transmission signal data at an input terminal 11-a, the polar modulator 11 outputs an amplitude component signal A of the transmission signal to an output terminal 11-b and, to an output terminal 11-c, an RF modulated signal C obtained by superposing the amplitude component and phase component of the transmission signal data on a carrier. The polar modulator 11 has even a function capable of setting the output timings of the amplitude component signal A and RF modulated signal C to desired values individually.

The power supply modulator 12 amplifies the amplitude component signal A to generate an amplified amplitude component signal B, and outputs the amplified amplitude component signal B to a power supply terminal 13-a of the RF amplifier 13.

The RF amplifier 13 receives the RF modulated signal C output to the output terminal 11-c of the polar modulator 11, and modulates the amplified amplitude component signal B input to the power supply terminal 13-a of the RF amplifier 13. A transmission signal D, which is an RF modulated signal obtained by superposing the amplitude component and phase component of the transmission signal data on a carrier and amplifying the resultant signal, is output to an output terminal 13-b of the RF amplifier 13.

The ET power amplifier 10 controls a voltage signal to be input to the power supply terminal 13-a of the RF amplifier 13 in accordance with the amplitude of the RF modulated signal C. More specifically, the power amplifier 10 decreases the voltage of a voltage signal to be input to the RF amplifier 13 when the power of the RF modulated signal C is low, and increases it when the power of the RF modulated signal is high. Hence, power wastefully consumed when an output from the RF amplifier 13 is low can be suppressed, improving the power efficiency.

An EER power amplifier 20 shown in FIG. 12 having the same arrangement as that of the ET power amplifier 10 adopts a technique of outputting, to an output terminal 21-c of a polar modulator 21, an RF phase modulated signal E obtained by superposing the phase component of a transmission signal on a carrier, inputting the RF phase modulated signal E to the RF amplifier 13, and amplifying the transmission signal.

Also in this case, a signal at the power supply terminal 13-a of the RF amplifier 13 is modulated in accordance with the amplitude component signal B. More specifically, the power amplifier 20 decreases the power supply voltage of the RF amplifier 13 when the amplitude of the transmission signal is small (low output), and increases it when the amplitude of the transmission signal is large (high output). Power wastefully consumed by a conventional power amplifier when an output from the RF amplifier is low can be suppressed, improving the power efficiency.

However, the power amplifiers 10 and 20 using these polar modulation schemes request the power supply modulator 12 of all wide band (high speed), wide dynamic range (high voltage and low noise), and high power efficiency characteristics. It is hard for the conventional techniques to meet these requests. More specifically, a transistor which forms the power supply modulator 12 tends to decrease the operation speed as the breakdown voltage rises. It is generally difficult to achieve both a high voltage operation and wide band (high speed) characteristic. A power amplifier which operates with relatively high power consumption in a wireless communication device hardly satisfies both a wide dynamic range and wide band (high speed characteristic).

For example, when the power supply modulator 12 is implemented by a linear regulator, it can achieve both a wide band (high speed) characteristic and wide dynamic range (low noise) characteristic. However, it is difficult to achieve high power efficiency due to dissipation to heat. When the power supply modulator 12 is implemented by a switching regulator, it can achieve high power efficiency, but can achieve neither a wide band (high speed) characteristic nor wide dynamic range (low noise) characteristic.

To solve these problems of the power amplifier using the polar modulation scheme, there has been proposed a technique (patent literature 1) in which an error correction unit for correcting a signal error is arranged in a power supply modulator formed from a high-power-efficiency switching amplifier, thereby achieving both a high power efficiency characteristic and low noise characteristic.

Power amplifiers which achieve concurrently a high power efficiency, a wide band, and low noise characteristic are also proposed by a technique (patent literature 2) using a power supply modulator configured by parallel-connecting a voltage source using a linear amplifier and a current source using a switching amplifier, and a technique (patent literature 3) using a power supply modulator configured by series-connecting a voltage source having a plurality of voltage values (including an error) and a voltage source having an error correction function.

RELATED ART LITERATURE

Patent Literature

Patent Literature 1: Japanese Patent Laid-Open No. 2007-215158
Patent Literature 2: Japanese Patent Laid-Open No. 2002-252524
Patent Literature 3: Japanese Patent Laid-Open No. 2006-514472

DISCLOSURE OF INVENTION

Problem to be Solved by the Invention

However, the technique disclosed in patent literature 1 is a technique of suppressing a signal distortion within an unnecessary signal band (high frequency) output from the switching amplifier, and cannot suppress a signal distortion within a desired signal band (low frequency). If even a signal distortion within a desired signal band is suppressed in the arrangement of patent literature 1, an unwanted current amount increases, decreasing the power efficiency. It is difficult to balance the signal error reduction amount (transmission signal precision) and the power efficiency.

The technique disclosed in patent literature 2 cannot correct a delay error generated between the voltage source (linear amplifier) and the current source (switching amplifier). Thus, an output current from the voltage source (linear amplifier) increases, and the power consumption rises.

In the technique disclosed in patent literature 3, power supplies need to be prepared by the same number as that of voltage sources having a plurality of voltage values, increasing the circuit complexity. In addition, suppressing the power consumption requires a larger number of voltage sources, resulting in a large circuit complexity and high cost.

From this, the techniques disclosed in patent literatures 1 to 3 have a problem that the power consumption increases when a power amplifier using the polar modulation technique tries to ensure the precision of a transmission signal and obtain characteristics requested of the power supply modulator, that is, a wide band (high speed), wide dynamic range (high voltage and low noise), and high power efficiency. Also, expansion of the circuit complexity raises the cost.

The present invention has been made to solve the above-described problems, and has as its exemplary object to provide a power amplifier capable of ensuring the precision of a transmission signal, reducing the power consumption by using a compact, low-cost circuit arrangement, and increasing the power efficiency from the conventional one.

Means of Solution to the Problem

In order to achieve the above-described exemplary object, a power amplifier according to the invention comprises a signal source control unit which generates, from an input signal containing an amplitude modulated component and a phase modulated component, an amplitude signal serving as the amplitude modulated component and a pulse modulated signal based on the amplitude signal, outputs the amplitude signal and the pulse modulated signal, and outputs a transmission signal obtained by superposing the input signal on a carrier, a delay adjustment unit which is connected to the signal source control unit, and synchronizes the amplitude signal, pulse modulated signal, and transmission signal output from the signal source control unit with each other, a voltage signal generation unit which is connected to the delay adjustment unit, and outputs a voltage signal corresponding to the amplitude signal synchronized with the transmission signal, a current signal generation unit which is connected to the delay adjustment unit, and outputs a current signal corresponding to the pulse modulated signal synchronized with the transmission signal, and a transmission signal amplification unit which is connected to the delay adjustment unit, the voltage signal generation unit, and the current signal generation unit, amplifies the transmission signal, and outputs a transmission signal obtained by modulating an amplitude of the amplified transmission signal based on the voltage signal and the current signal.

Effects of the Invention

According to the present invention, an amplitude signal serving as the amplitude modulated component of an input signal and a pulse modulated signal based on the amplitude modulated component are generated. The amplitude signal and pulse modulated signal are synchronized with a transmission signal and amplified, generating a voltage signal and current signal. This can eliminate a delay error generated between the voltage signal and the current signal, and suppress degradation of the precision of an output signal and an increase in current consumption which are caused by the delay error. While ensuring the signal precision, the power consumption can be suppressed.

The power amplifier according to the present invention outputs a transmission signal obtained by modulating the amplitude of the transmission signal based on a modulated power supply signal generated by synthesizing the voltage signal and current signal. The power amplifier can ensure the precision of the transmission signal, reduce the power consumption, and increase the power efficiency more than the conventional one.

BEST MODE FOR CARRYING OUT THE INVENTION

Exemplary embodiments of the present invention will now be described with reference to the accompanying drawings.

[First Exemplary Embodiment]

A power amplifier according to the first exemplary embodiment of the present invention is used in a wireless communication device. The power amplifier amplifies power by modulating the amplitude of an input signal input to the power amplifier in accordance with a power source modulated signal generated based on the amplitude modulated component of the input signal. Then, the power amplifier outputs a transmission signal to be transmitted from the wireless communication device.

Figure 1:
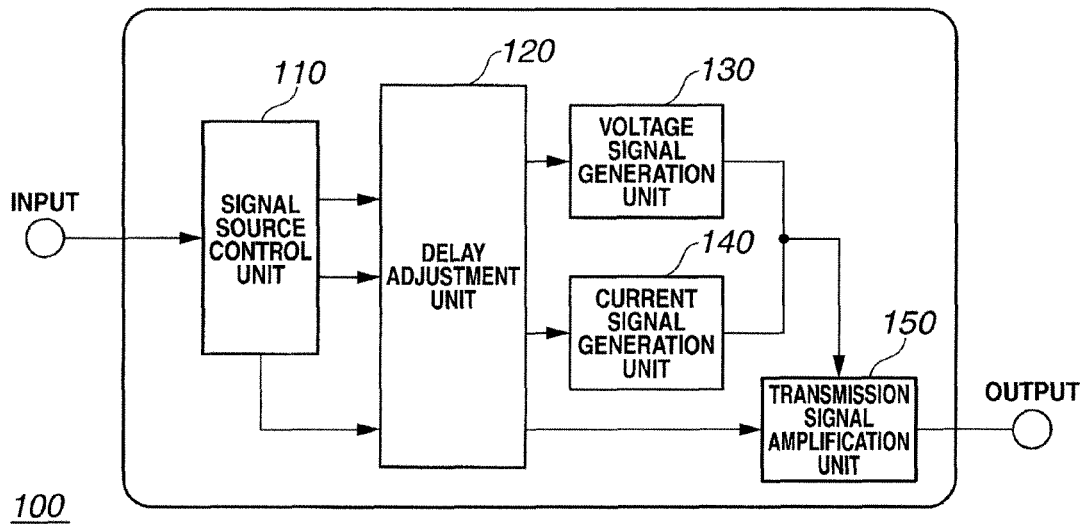
FIG. 1 is a block diagram showing the arrangement of a power amplifier according to the first exemplary embodiment of the present invention.

As shown in FIG. 1, a power amplifier 100 according to the first exemplary embodiment includes a signal source control unit 110, delay adjustment unit 120, voltage signal generation unit 130, current signal generation unit 140, and transmission signal amplification unit 150.

Of the amplitude modulated component and phase modulated component of an input signal, the signal source control unit 110 outputs the amplitude modulated component as an amplitude signal. In addition, the signal source control unit 110 generates a pulse modulated signal based on the amplitude modulated component of the input signal, and outputs it. Further, the signal source control unit 110 generates a transmission signal by superposing the input signal on a carrier, and outputs it.

The delay adjustment unit 120 adjusts delay times for the amplitude signal, pulse modulated signal, and transmission signal output from the signal source control unit 110, and corrects relative delay times generated between these signals. More specifically, the delay adjustment unit 120 synchronizes the amplitude signal, pulse modulated signal, and transmission signal with each other.

The voltage signal generation unit 130 generates and outputs a voltage signal corresponding to the amplitude signal having a delay time adjusted by the delay adjustment unit 120.

The current signal generation unit 140 generates and outputs a current signal corresponding to the pulse modulated signal having a delay time adjusted by the delay adjustment unit 120.

The transmission signal amplification unit 150 amplifies the transmission signal which has been output from the signal source control unit 110 and has a delay time adjusted by the delay adjustment unit 120. Then, the transmission signal amplification unit 150 outputs a transmission signal obtained by modulating the amplitude of the amplified transmission signal based on a modulated power supply signal generated by synthesizing the voltage signal output from the voltage signal generation unit 130 and the current signal output from the current signal generation unit 140.

The power amplifier according to the first exemplary embodiment generates an amplitude signal serving as the amplitude modulated component of an input signal and a pulse modulated signal based on the amplitude modulated component, synchronizes the amplitude signal and pulse modulated signal with a transmission signal, and then amplifies the amplitude signal and pulse modulated signal to generate a voltage signal and current signal. The power amplifier can eliminate a delay error generated between the voltage signal and the current signal, and suppress degradation of the precision of an output signal and an increase in current consumption which are caused by the delay error.

The power amplifier according to the first exemplary embodiment outputs a transmission signal obtained by modulating the amplitude of the transmission signal based on a modulated power supply signal generated by synthesizing the voltage signal and current signal. The power amplifier can ensure the precision of the transmission signal, reduce the power consumption, and increase the power efficiency more than the conventional one.

[Second Exemplary Embodiment]

In a power amplifier according to the second exemplary embodiment of the present invention, the voltage signal generation unit of the power amplifier 100 described in the first exemplary embodiment is formed from a linear amplifier, and the current signal generation unit is formed from a switching amplifier.

Figure 2:
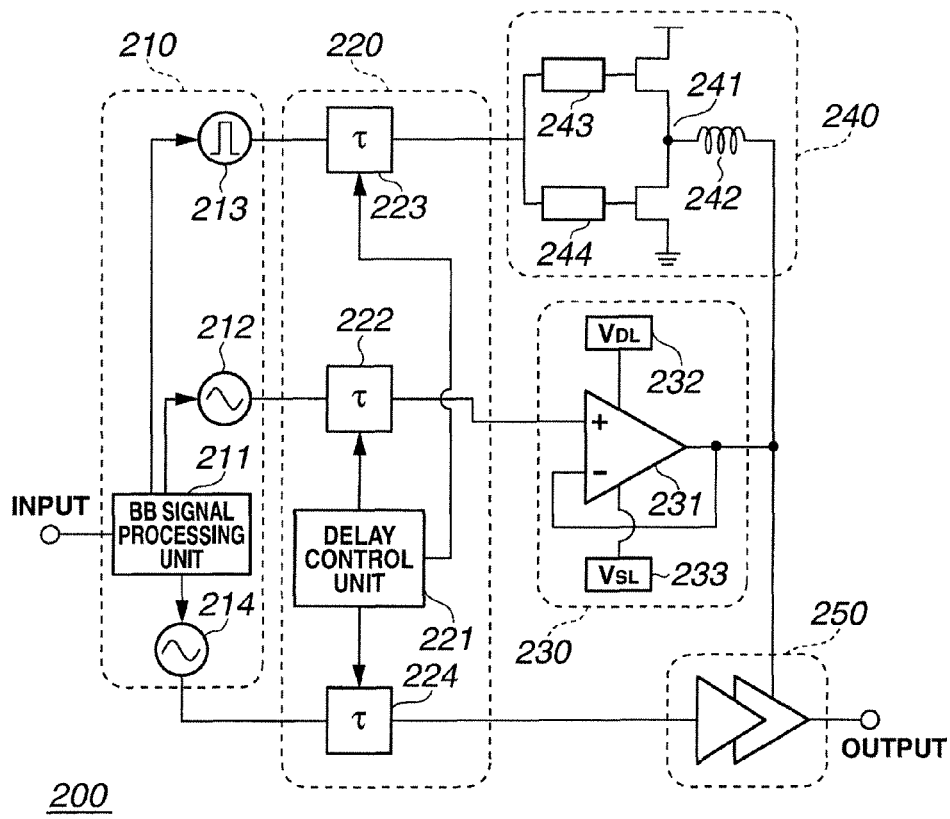
FIG. 2 is a block diagram showing the arrangement of a power amplifier according to the second exemplary embodiment of the present invention.

As shown in FIG. 2, a power amplifier 200 according to the second exemplary embodiment includes a signal source control unit 210, delay adjustment unit 220, voltage signal generation unit 230, current signal generation unit 240, and transmission signal amplification unit 250.

The signal source control unit 210 includes a baseband (BB) signal processing unit 211, amplitude signal generation unit 212, pulse signal generation unit 213, and RF modulated signal generation unit 214.

The BB signal processing unit 211 derives, from an input baseband signal, an amplitude signal serving as the amplitude component of the baseband signal, a pulse signal obtained by pulse-modulating the amplitude signal, and an RF modulated signal obtained by synthesizing the input baseband signal and a carrier.

The amplitude signal generation unit 212 generates and outputs the amplitude signal derived by the BB signal processing unit 211.

The pulse signal generation unit 213 generates and outputs the pulse signal derived by the BB signal processing unit 211.

The RF modulated signal generation unit 214 generates and outputs the RF modulated signal derived by the BB signal processing unit 211.

The delay adjustment unit 220 includes a delay control unit 221, first delay circuit 222, second delay circuit 223, and third delay circuit 224.

The delay control unit 221 determines delay times for the amplitude signal output from the amplitude signal generation unit 212, the pulse signal output from the pulse signal generation unit 213, and the RF modulated signal output from the RF modulated signal generation unit 214. The delay control unit 221 adjusts the synchronization timing between these signals.

The first delay circuit 222 reflects, in the amplitude signal, the delay time determined by the delay control unit 221 for the amplitude signal.

The second delay circuit 223 reflects, in the pulse signal, the delay time determined by the delay control unit 221 for the pulse signal.

The third delay circuit 224 reflects, in the RF modulated signal, the delay time determined by the delay control unit 221 for the RF modulated signal.

The voltage signal generation unit 230 includes a voltage follower linear amplifier 231, and power supply units 232 and 233 which supply power to the linear amplifier 231. The voltage signal generation unit 230 outputs a voltage signal obtained by amplifying the amplitude signal having a delay time adjusted by the first delay circuit 222.

The current signal generation unit 240 includes an inverter-type switching amplifier 241, inductor 242, high-side gate driver 243, and low-side gate driver 244. The current signal generation unit 240 outputs a current signal obtained by amplifying the pulse signal having a delay time adjusted by the second delay circuit 223.

The transmission signal amplification unit 250 amplifies the RF modulated signal having a delay time adjusted by the third delay circuit 224. In addition, the transmission signal amplification unit 250 receives, as a power supply signal, a modulated power supply signal obtained by synthesizing the voltage signal output from the voltage signal generation unit 230 and the current signal output from the current signal generation unit 240. Then, the transmission signal amplification unit 250 modulates the amplitude and outputs a transmission signal.

The operation of the power amplifier 200 according to the second exemplary embodiment will be explained.

When the signal source control unit 210 receives a baseband signal as an input signal, the BB signal processing unit 211 derives an amplitude signal and phase signal from the baseband signal, derives a pulse signal obtained by pulse-modulating the derived amplitude signal, and derives an RF modulated signal from the input baseband signal and a carrier.

For example, when a wireless communication device incorporating the power amplifier according to the exemplary embodiment executes QPSK modulation, an amplitude signal $A(t)$, phase signal $\theta(t)$, and RF modulated signal $V(t)$ derived by the BB signal processing unit 211 from an in-phase signal $I(t)$ and quadrature signal $Q(t)$ serving as baseband signals are given as follows:

$$A(t) = \mathrm{sqrt}(I(t)^2 + Q(t)^2) \quad (1)$$

$$\theta(t) = \arctan\{Q(t)/I(t)\} \quad (2)$$

$$V(t) = A(t)\cos(\omega_c t + \theta(t)) \quad (3)$$

($\omega_c$ is the carrier angular frequency)

The pulse signal derived by the BB signal processing unit 211, that is, $V_g(t)$ obtained by pulse-modulating the amplitude signal $A(t)$ is determined on condition that the difference between the output current $I_M(t)$ of the current signal generation unit 240 and the power supply current (synthesized current of the voltage signal generation unit 230 and current signal generation unit 240) $I_{out}(t)$ of the transmission signal amplification unit 250 does not exceed a predetermined value $I_{MAX}$.

For example, an equation $I_M(t) = f[V_g(t)]$ which models the relationship between the pulse signal $V_g(t)$ serving as the input voltage of the current signal generation unit 240 and the output current $I_M(t)$, and an equation $I_{out}(t) = h[A(t)]$ which models the relationship between the amplitude component $A(t)$ of the RF modulated signal serving as the input signal of the transmission signal amplification unit 250 and the power supply current $I_{out}(t)$ are prepared. These equations may be derived from measured evaluation results or analytically from a circuit model.

From these two model equations, the difference between the output current $I_M(t)$ of the current signal generation unit 240 and the power supply current $I_{out}(t)$ of the transmission signal amplification unit 250 can be given by $I_{out}(t) - f[V_g(t)]$. This represents that the difference amount between the output current $I_M(t)$ of the current signal generation unit 240 and the power supply current $I_{out}(t)$ of the transmission signal amplification unit 250 increases monotonically when the pulse signal $V_g(t)$ is at high level and decreases monotonically when the pulse signal $V_g(t)$ is at low level.

The BB signal processing unit 211 calculates the power supply current $I_{out}(t)$ of the transmission signal amplification unit 250 from the amplitude component $A(t)$ of the RF modulated signal. The BB signal processing unit 211 can determine the pulse signal $V_g(t)$ which satisfies a condition $|I_{out}(t) - I_M(t)| < I_{MAX}$, based on an algorithm which switches $V_g(t)$ from low level to high level when $I_{out}(t) - f[V_g(t)]$ reaches $-I_{MAX}$ and switches $V_g(t)$ from high level to low level when $I_{out}(t) - f[V_g(t)]$ reaches $+I_{MAX}$.

In this manner, the amplitude signal $A(t)$, pulse signal $V_g(t)$, and RF modulated signal $V(t)$ derived by the BB signal processing unit 211 are output from the amplitude signal generation unit 212, pulse signal generation unit 213, and RF modulated signal generation unit 214, respectively.

The synchronization timing between the amplitude signal, pulse signal, and RF modulated signal output from the signal source control unit 210 is adjusted by reflecting, by corresponding delay circuits, delay times determined by the delay control unit 221 for the respective signals. More specifically, the first delay circuit reflects the delay time of the amplitude signal, the second delay circuit reflects that of the pulse signal, and the third delay circuit reflects that of the RE modulated signal (synchronization timing is adjusted). As a result, the relative delay times between these signals are corrected.

The amplitude signal and pulse signal, the relative delay time between which has been corrected by the delay adjustment unit 220, are respectively amplified by the voltage signal generation unit 230 and current signal generation unit 240, and output as a voltage signal and current signal.

More specifically, the voltage signal generation unit 230 amplifies the synchronization timing-corrected amplitude signal, and outputs it as a voltage signal ($V_c \propto A(t)$) for modulating the power supply of the transmission signal amplification unit 250. Upon receiving the synchronization timing-corrected pulse signal ($V_g(t)$), the current signal generation unit 240 supplies the output current $I_M$ output based on the pulse signal to the transmission signal amplification unit 250, and outputs a current signal.

The transmission signal amplification unit 250 amplifies the input synchronization timing-corrected RF modulated signal. The transmission signal amplification unit 250 modulates the amplitude of the amplified RF modulated signal based on a modulated power supply signal obtained by synthesizing the voltage signal V, output from the voltage signal generation unit 230 and the current signal output from the current signal generation unit 240. The transmission signal amplification unit 250 outputs a transmission signal obtained by amplifying the RF modulated signal (transmission signal) by polar modulation.

As described above, the power amplifier 200 according to the second exemplary embodiment corrects the relative delay time between the voltage signal and the current signal. The power amplifier 200 has an effect capable of suppressing an increase in the power consumption of the voltage signal generation unit 230 that is caused by the relative delay time.

Also, the switching frequency of the pulse signal $V_g(t)$ is increased so that the output current $I_M(t)$ of the current signal generation unit 240 can accurately track the power supply current $I_{out}(t)$ of the transmission signal amplification unit 250. The output current and power consumption of the voltage signal generation unit 230 can be reduced.

The relative delay time between the voltage signal and the current signal is corrected, and the switching frequency of the pulse signal $V_g(t)$ is increased. By this signal processing not accompanied by expansion of the circuit complexity, the precision of a transmission signal transmitted from the power amplifier can be ensured, the power consumption can be reduced by using a compact, low-cost circuit arrangement, and the power efficiency can be increased more than the conventional one.

[Third Exemplary Embodiment]

A power amplifier according to the third exemplary embodiment of the present invention measures an amplified transmission signal, and derives the adjacent channel power ratio (ACPR) of the transmission signal. The power amplifier controls the building components of the power amplifier based on the ACPR, and amplifies an input signal.

Note that the same reference numerals as those in the second exemplary embodiment denote building components having the same arrangements and functions in the power amplifier according to the third exemplary embodiment, and a detailed description thereof will not be repeated.

Figure 3:
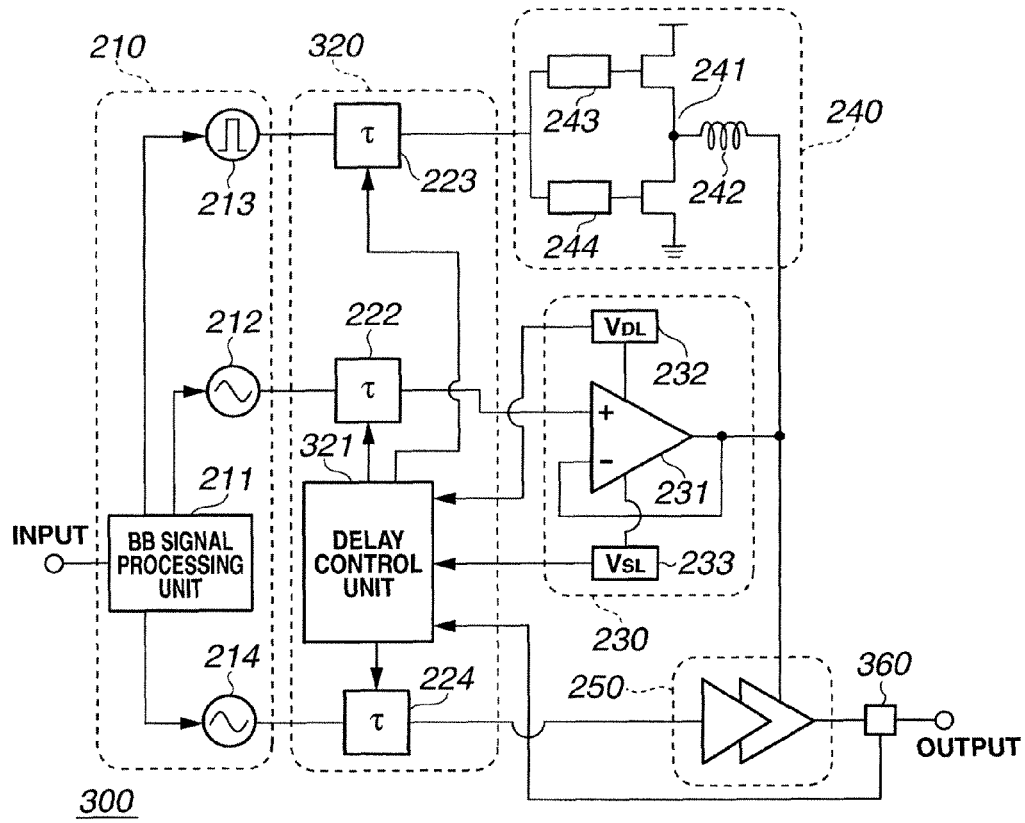
FIG. 3 is a block diagram showing the arrangement of a power amplifier according to the third exemplary embodiment of the present invention.

As shown in FIG. 3, a power amplifier 300 according to the third exemplary embodiment includes a signal source control unit 210, delay adjustment unit 320, voltage signal generation unit 230, current signal generation unit 240, transmission signal amplification unit 250, and transmission signal feedback unit 360. The transmission signal feedback unit 360 can be a coupler which branches an RF signal into two.

Referring to FIG. 3, in the power amplifier 300 according to the third exemplary embodiment, a transmission signal output from the transmission signal amplification unit 250 is fed back to a delay control unit 321 of the delay adjustment unit 320 via the transmission signal feedback unit 360.

Figure 4:
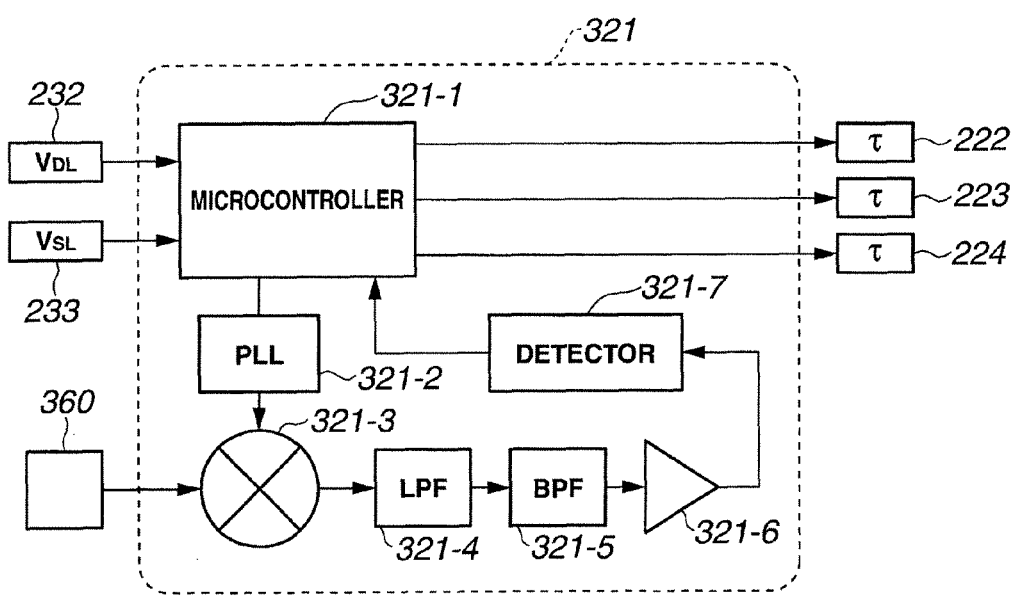
FIG. 4 is a block diagram showing the arrangement of the control unit of the power amplifier according to the third exemplary embodiment.

FIG. 4 is a block diagram exemplifying the arrangement of the delay control unit 321 in the power amplifier 300 according to the third exemplary embodiment.

As shown in FIG. 4, the delay control unit 321 includes a microcontroller 321-1, PLL (Phase-Locked Loop) 321-2, mixer 321-3, LPF (Low-Pass Filter) 321-4, BPF (Band-Pass Filter) 321-5, log amplifier 321-6, and detector 321-7.

The microcontroller 321-1 derives delay times for the amplitude signal, pulse signal, and RF modulated signal based on each input data, and controls first to third delay circuits 222 to 224.

The microcontroller 321-1 is formed from an arithmetic unit such as a computer including a CPU (Central Processing Unit), memory, and interface. By installing a computer program in the computer, the hardware resource of the computer and the computer program (software) derive delay times for the respective signals in cooperation with each other. Note that the computer program may be provided in the form in which it is stored in a computer-readable recording medium.

The PLL 321-2 is connected to the microcontroller 321-1, and outputs a local oscillation signal (LO signal) to the mixer 321-3.

The mixer 321-3 mixes the LO signal output from the PLL 321-2 via a single-stage amplifier, and a transmission signal input to the delay control unit 321 via the transmission signal feedback unit 360, and outputs an intermediate frequency (IF) signal to the LPF 321-4.

The LPF 321-4 removes an unnecessary high-frequency component contained in the IF signal output from the mixer 321-3. A predetermined frequency component of the IF signal having passed through the LPF 321-4 passes through the BPF 321-5.

When the BPF 321-5 is designed so that a frequency component corresponding to an adjacent channel of the transmission signal passes through the BPF 321-5, the center frequency of the BPF 321-5 is set to either the IF frequency+ offset frequency or the IF frequency−offset frequency. The offset frequency and BPF passband are determined by the communication standard.

For example, in the WCDMA (Wideband Code Division Multiple Access) standard, the offset frequency is set to 5 MHz, and the passband is set to 3.84 MHz.

The log amplifier 321-6 performs log scale conversion for the signal of a frequency component corresponding to the adjacent channel of the transmission signal having passed through the BPF 321-5, and outputs the resultant signal to the detector 321-7.

The detector 321-7 down-coverts the signal output from the log amplifier 321-6 from the IF band to the baseband, and outputs the down-converted signal to the microcontroller 321-1. The detector 321-7 can be formed from, for example, a diode, capacitor, and resistor.

With this arrangement, the microcontroller 321-1 detects the ACPR of a transmission signal input to the delay control unit 321 via the transmission signal feedback unit 360, and stores the detected ACPR data in the memory.

Then, the microcontroller 321-1 detects powers supplied to the linear amplifier 231 from the power supply units 232 and 233 which supply powers to the linear amplifier 231 of the voltage signal generation unit 230. The microcontroller 321-1 stores the detected power data in the memory.

Based on the ACPR data of the transmission signal and the data of the supply powers of the power supply units 232 and 233 (power consumption of the linear amplifier 231) which are stored, the microcontroller 321-1 sets delay times for the amplitude signal, pulse signal, and RF modulated signal to minimize the power consumption of the linear amplifier 231 and the ACPR of the transmission signal.

Figure 5:
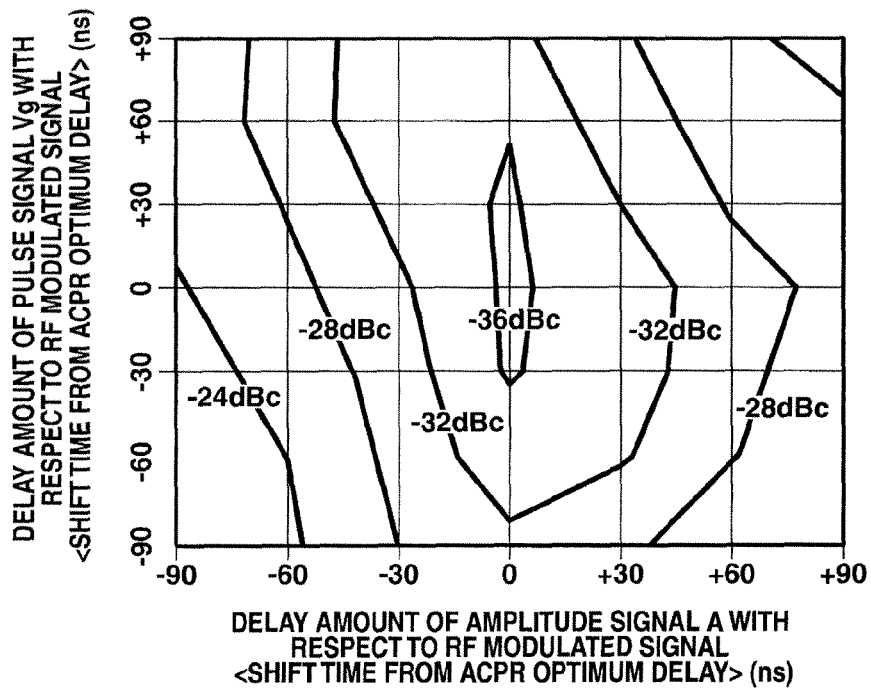
FIG. 5 is a graph exemplifying the adjacent channel power ratio of the output signal of a power amplifier 300 according to the third exemplary embodiment.
Figure 6:
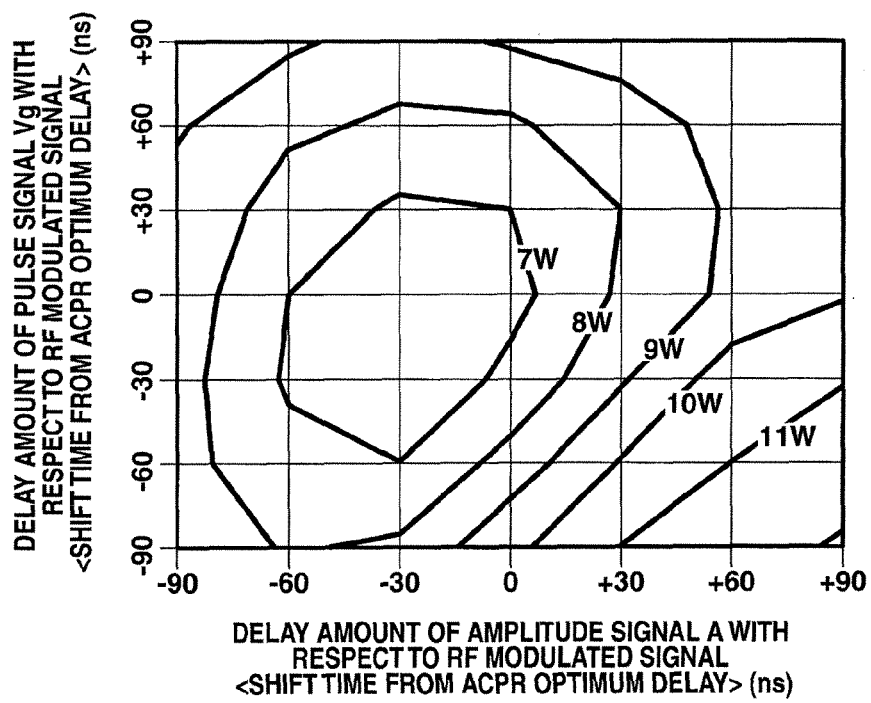
FIG. 6 is a graph exemplifying the power consumption of a linear amplifier serving as a building component of the voltage signal generation unit of the power amplifier according to the third exemplary embodiment.

FIG. 5 exemplifies the ACPR of a transmission signal output from the transmission signal amplification unit 250 when the abscissa indicates the delay time of the amplitude signal A(t) with respect to the RF modulated signal V(t) and the ordinate indicates the delay time of the pulse signal $V_g(t)$ with respect to the RF modulated signal. FIG. 6 exemplifies power consumed by the linear amplifier 231.

As shown in FIGS. 5 and 6, the ACPR of a transmission signal output from the transmission signal amplification unit 250 and the power consumption of the linear amplifier 231 vary depending on the relative delay times between the RF modulated signal V(t), the amplitude signal A(t), and the pulse signal $V_g(t)$ (RF modulated signal V(t), amplitude signal A(t), and pulse signal $V_g(t)$ will be referred to as "respective signals" at once). Further, the relative delay times have a characteristic surface which projects downward.

The microcontroller 321-1 derives the relative delay times between the respective signals to minimize the ACPR of the transmission signal and the power consumption of the linear amplifier 231 (supply powers of the power supply units 232 and 233) according to the steepest descent method of calculating a gradient vector indicating a direction in which the characteristic surface descends most steeply, and setting the relative delay times between the respective signals in the direction indicated by the vector.

Also, when delay times for the respective signals that minimize the ACPR of the transmission signal and delay times for the respective signals that minimize the supply powers of the power supply units 232 and 233 are different, the microcontroller 321-1 sets, as delay times for the respective signals, the intermediate values of the delay times that minimize these differences.

In the power amplifier 300 according to the third exemplary embodiment, the delay control unit 321 measures the ACPR of the transmission signal and the power consumption of the linear amplifier 231. Based on the measurement results, the delay control unit 321 can set delay times for the respective signals that minimize the ACPR and power consumption.

The third exemplary embodiment can omit processes such as pre-verification of deriving the delay times of the respective signals based on, for example, the circuit models of the voltage signal generation unit 230, current signal generation unit 240, and transmission signal amplification unit 250, thereby reducing the cost.

The delay times of the respective signals are sequentially set based on the measurement results of the actual operation of an actual circuit, instead of setting the delay times of the respective signals by pre-verification based on the circuit model or the like. Thus, a more accurate characteristic can be obtained, compared to setting the delay times of the respective signals by pre-verification.

[Fourth Exemplary Embodiment]

Figure 7:
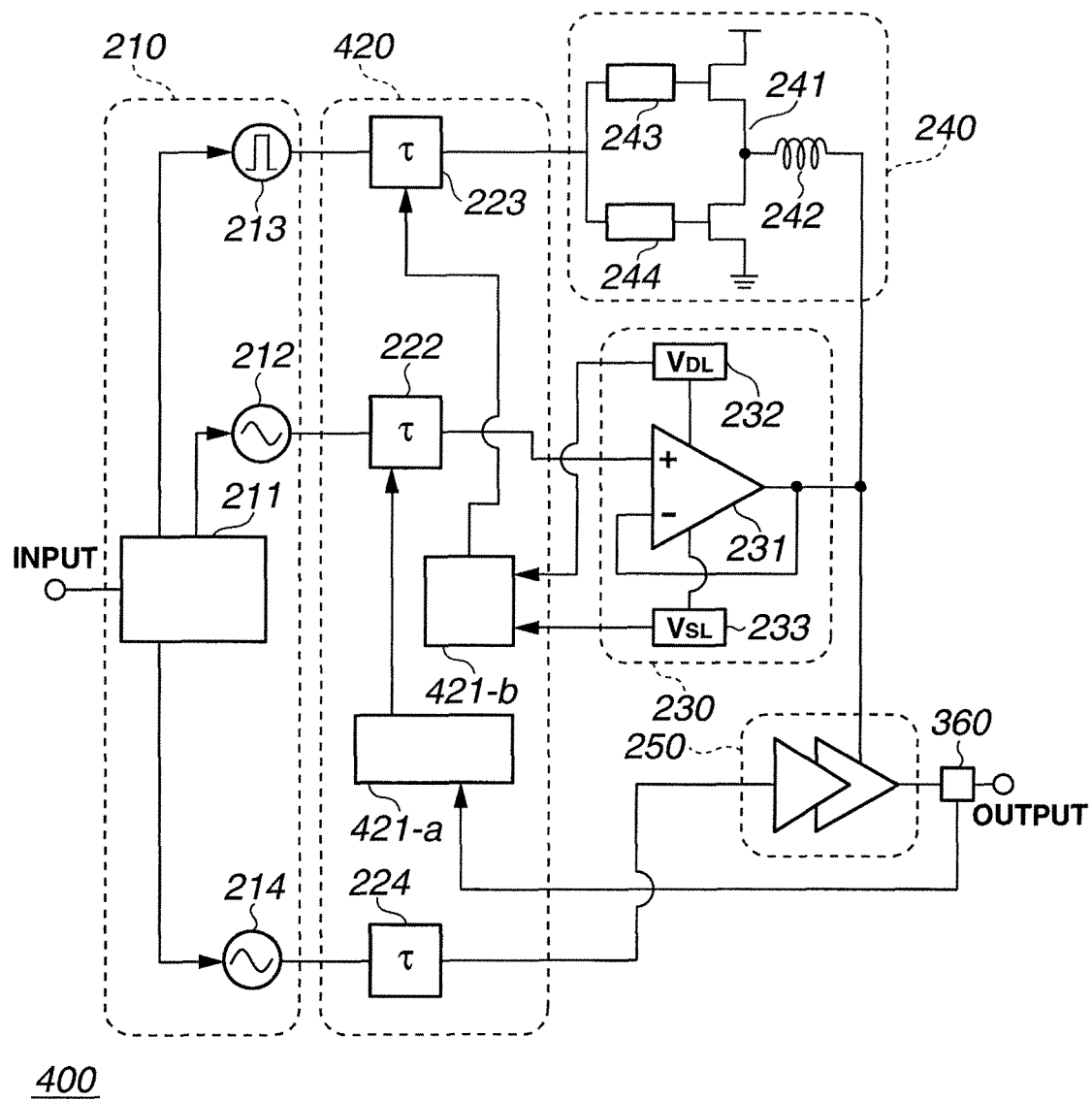
FIG. 7 is a block diagram showing the arrangement of a power amplifier according to the fourth exemplary embodiment of the present invention.

FIG. 7 is a block diagram showing the arrangement of a power amplifier according to the fourth exemplary embodiment of the present invention.

A power amplifier 400 according to the fourth exemplary embodiment derives the delay time of the amplitude signal A(t) based on the measured ACPR of a transmission signal, and that of the pulse signal $V_g(t)$ based on the power consumption of a linear amplifier 231.

Note that the same reference numerals as those in the third exemplary embodiment denote building components having the same arrangements and functions in the power amplifier according to the fourth exemplary embodiment, and a detailed description thereof will not be repeated.

As shown in FIG. 5, the ACPR of a transmission signal output from a transmission signal amplification unit 250 hardly varies with respect to the delay time of the pulse signal $V_g(t)$. To minimize the ACPR of the transmission signal, only the delay time of the amplitude signal A(t) is adjusted as a parameter without adopting the delay time of the pulse signal $V_g(t)$ as a parameter.

The power amplifier 400 according to the fourth exemplary embodiment applies the steepest descent method to a one-variable function indicating the relationship between the delay time of the amplitude signal A(t) and the ACPR of the transmission signal, and a one-variable function indicating the relationship between the delay time of the pulse signal $V_g(t)$ and the supply power amounts of power supplies 232 and 233. A delay control unit (A) 421-a derives and sets the delay time of the amplitude signal A(t), and a delay control unit (B) 421-b derives and sets that of the pulse signal $V_g(t)$.

Thus, the calculation amount becomes much smaller in the power amplifier 400 according to the fourth exemplary embodiment which derives delay times for the respective signals by the steepest descent method using one-variable functions, than in the power amplifier 300 which derives and sets delay times for the respective signals by the steepest descent method using a two-variable function (delay characteristic surface) described in the third exemplary embodiment. The power amplifier 400 can therefore simplify the circuit arrangement.

[Fifth Exemplary Embodiment]

Figure 8:
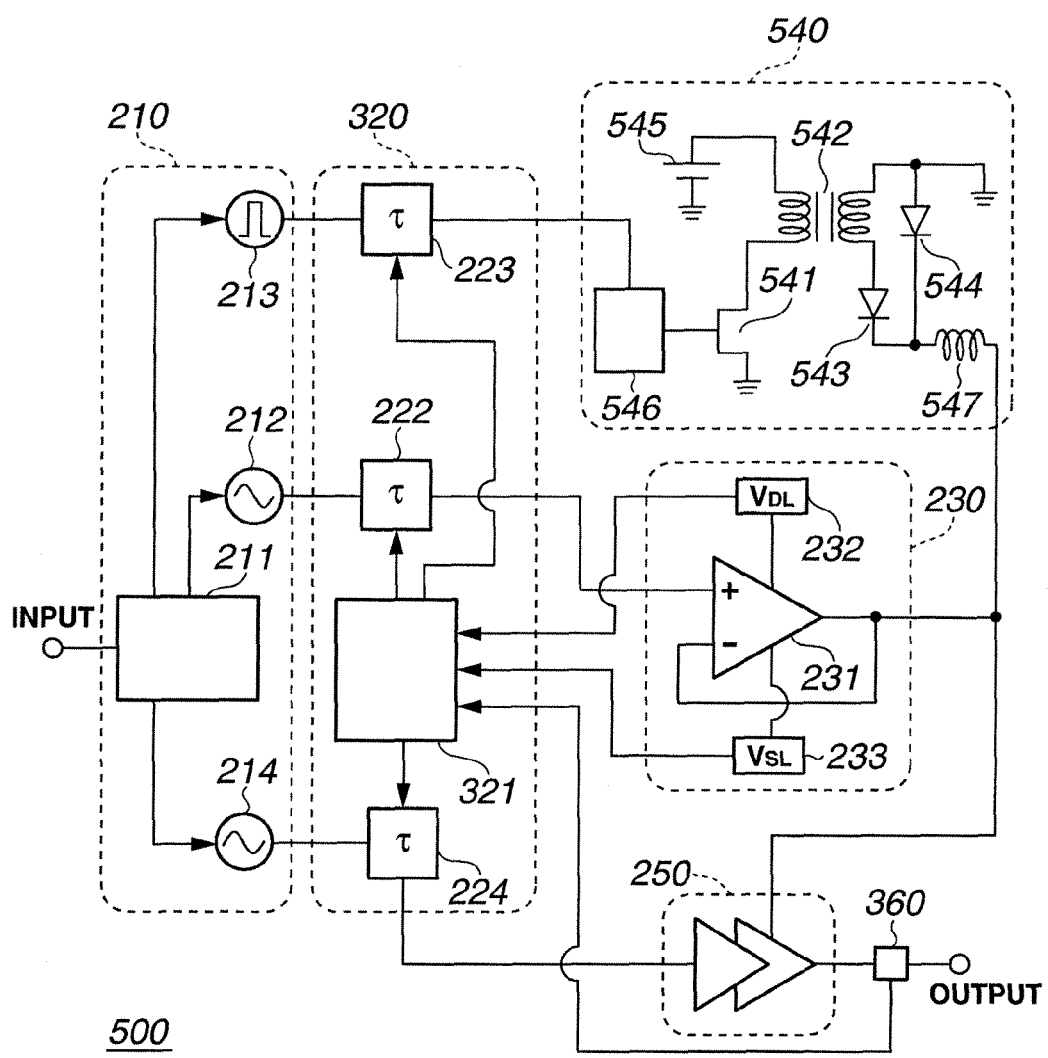
FIG. 8 is a block diagram showing the arrangement of a power amplifier according to the fifth exemplary embodiment of the present invention.

FIG. 8 is a block diagram showing the arrangement of a power amplifier according to the fifth exemplary embodiment of the present invention.

As shown in FIG. 8, in a power amplifier 500 according to the fifth exemplary embodiment, a current signal generation unit 540 is implemented by a forward converter switching amplifier including a switching element 541, a transformer 542, diodes 543 and 544, a power supply 545, and a gate driver 546.

Note that the same reference numerals as those in the third exemplary embodiment denote building components having the same arrangements and functions in the power amplifier according to the fifth exemplary embodiment, and a detailed description thereof will not be repeated.

The power amplifier 500 according to the fifth exemplary embodiment does not require an arrangement specialized in a high-voltage operation, unlike a current signal generation unit formed from an inverter switching amplifier. Therefore, the power amplifier 500 can reduce the power consumption and decrease the risk of damaging components by a high-voltage operation.

[Sixth Exemplary Embodiment]

Figure 9:
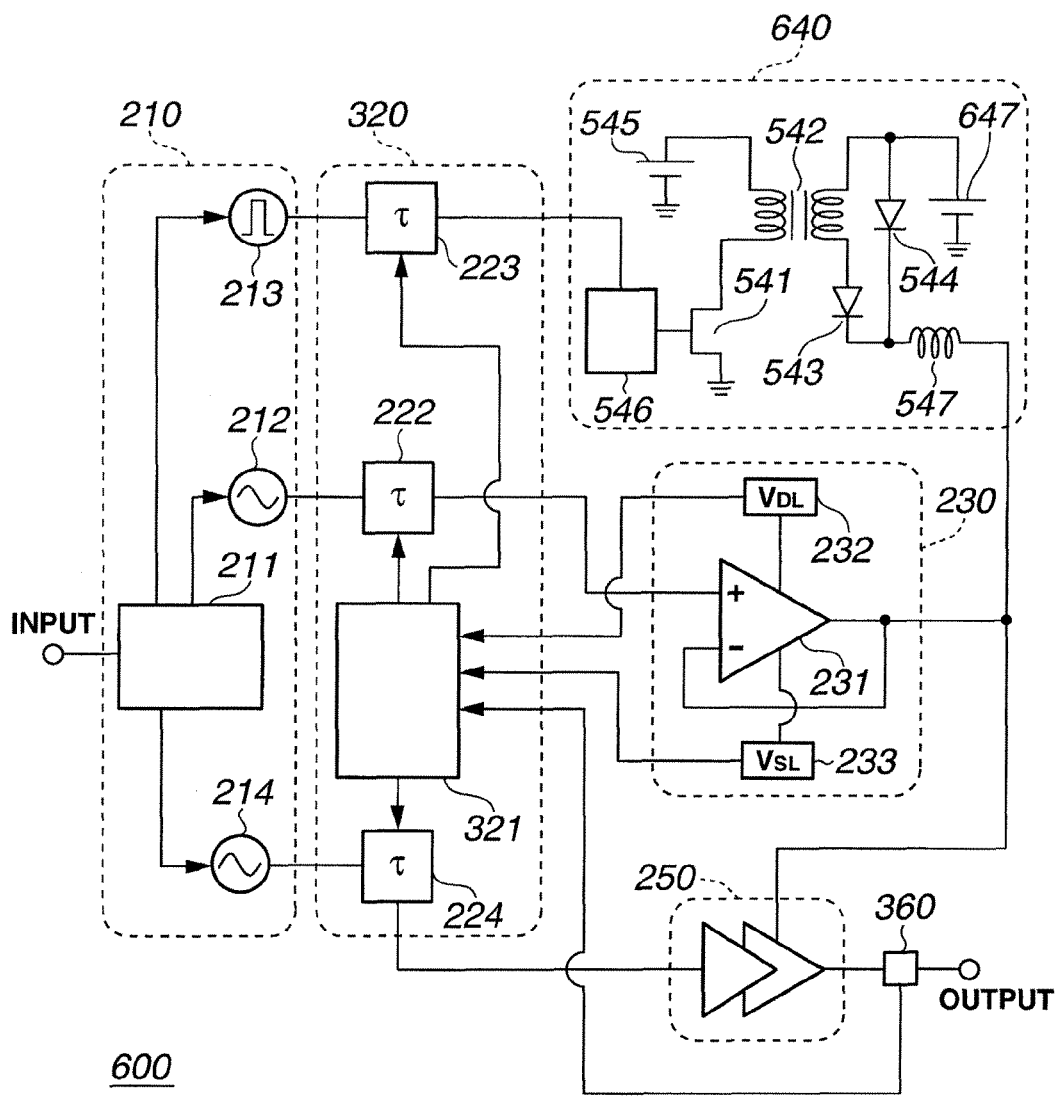
FIG. 9 is a block diagram showing the arrangement of a power amplifier according to the sixth exemplary embodiment of the present invention.

FIG. 9 is a block diagram showing the arrangement of a power amplifier according to the sixth exemplary embodiment of the present invention.

As shown in FIG. 9, a power amplifier 600 according to the sixth exemplary embodiment is implemented by a forward converter switching amplifier in which a power supply 647 is added to the arrangement of the current signal generation unit 540 described in the fifth exemplary embodiment.

Note that the same reference numerals as those in the fifth exemplary embodiment denote building components having the same arrangements and functions in the power amplifier according to the sixth exemplary embodiment, and a detailed description thereof will not be repeated.

In the power amplifier 600 according to the sixth exemplary embodiment, a low-loss power supply path extending from the power supply 647 via diodes 543 and 544 can be formed by adding the power supply 647 to a current signal generation unit 640. The efficiency of power supplied to a transmission signal amplification unit 250 can be increased.

[Seventh Exemplary Embodiment]

Figure 10:
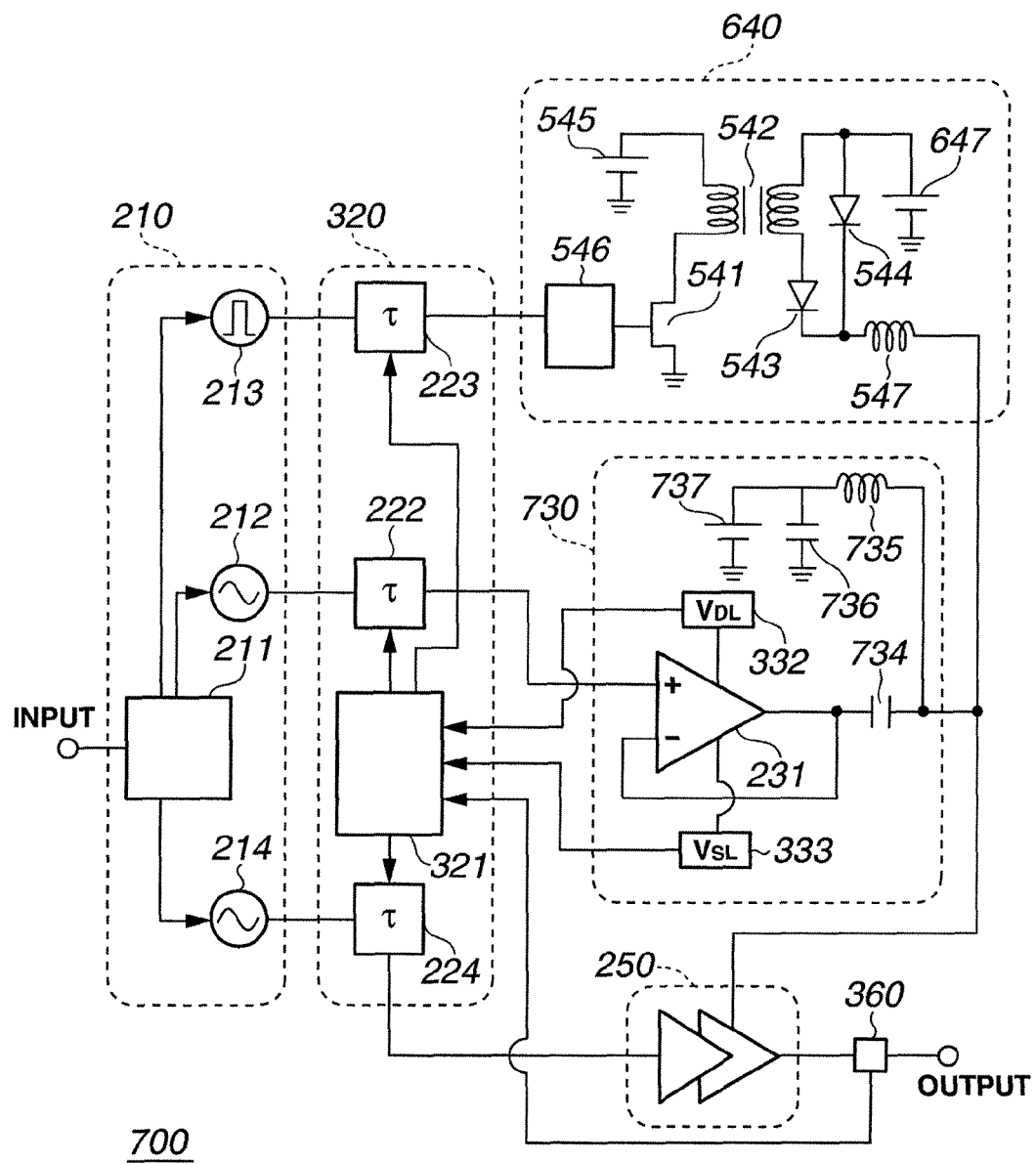
FIG. 10 is a block diagram showing the arrangement of a power amplifier according to the seventh exemplary embodiment of the present invention.
Figure 11:
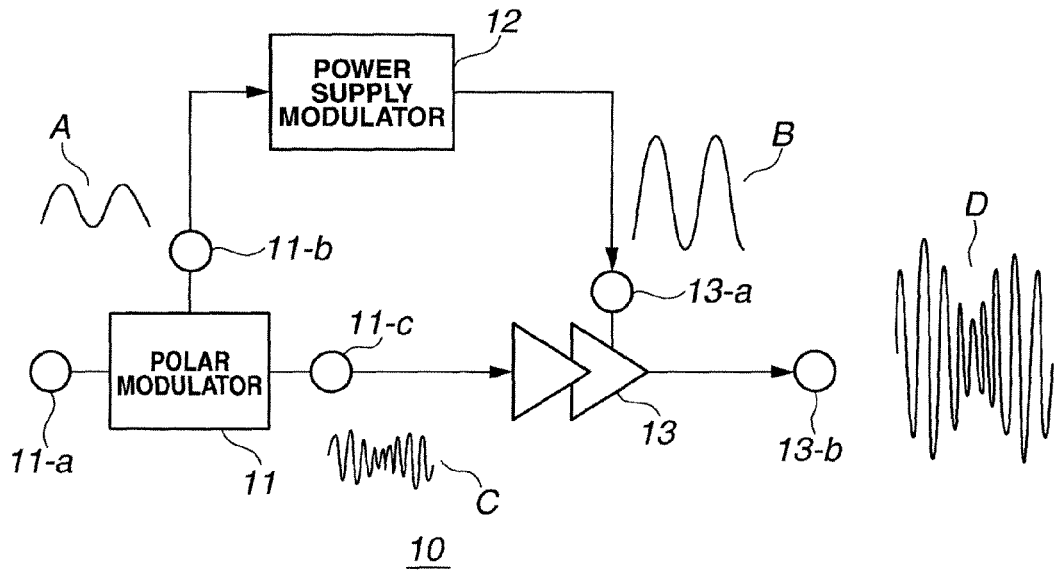
FIG. 11 is a block diagram showing an outline of a power amplifier based on an ET (Envelope Tracking) scheme.
Figure 12:
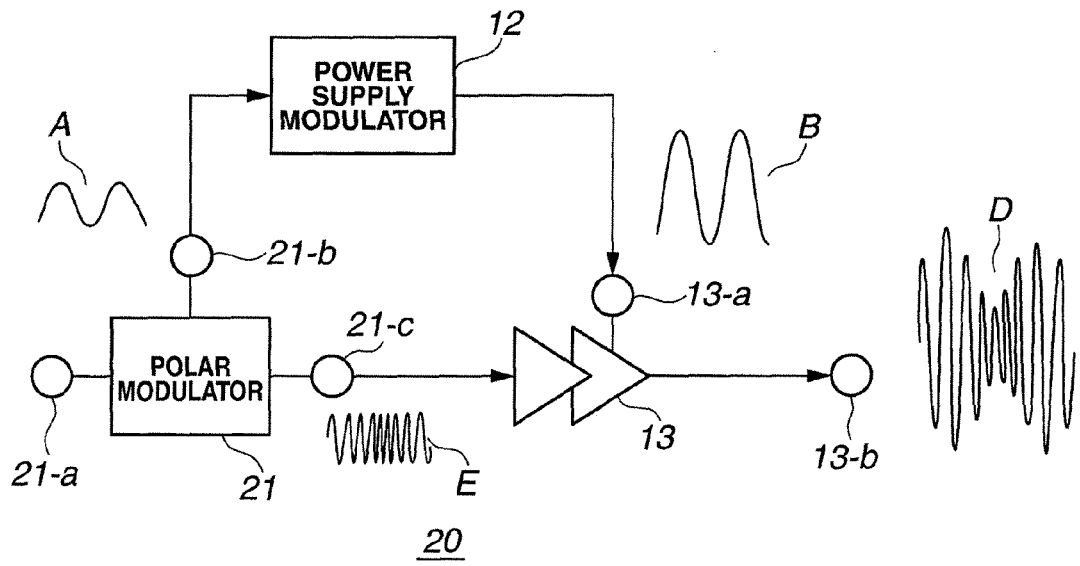
FIG. 12 is a block diagram showing an outline of a power amplifier based on an EER (Envelope Elimination and Restoration) scheme.

FIG. 10 is a block diagram showing the arrangement of a power amplifier according to the seventh exemplary embodiment of the present invention.

As shown in FIG. 10, in a power amplifier 700 according to the seventh exemplary embodiment, a voltage signal generation unit 730 is configured by arranging a high-pass filter formed from a capacitor 734 at the output of a linear amplifier 231, and connecting a power supply 737 to the output (capacitor 734) of the high-pass filter via a low-pass filter formed from an inductor 735 and capacitor 736.

Note that the same reference numerals as those in the sixth exemplary embodiment denote building components having the same arrangements and functions in the power amplifier according to the seventh exemplary embodiment, and a detailed description thereof will not be repeated.

In the power amplifier 700 according to the seventh exemplary embodiment, the voltage signal generation unit 730 is divided into the linear amplifier 231 which outputs a high-frequency component of a low voltage and large current, and the power supply 737 which outputs a low-frequency voltage component of a high voltage and low current. The power amplifier 700 can reduce the power consumption of the linear amplifier, compared to outputting all the frequency voltage components of a high voltage and high current from the linear amplifier.

Note that an amplitude signal output from the signal source control unit of the power amplifier described in each of the first to seventh exemplary embodiments of the present invention may be one extracted by a polar modulator.

Also, a transmission signal output from the signal source control unit of the power amplifier described in each of the first to seventh exemplary embodiments of the present invention may be a signal obtained by superposing, on a carrier, a phase signal serving as the phase modulated component of an input signal input to the signal source control unit.

Some or all of the above exemplary embodiments are also described as the following Supplementary notes. However, the present invention is not limited to the following appendices.

(Supplementary note 1) A power amplifier is characterized by comprising a signal source control unit which generates, from an input signal containing an amplitude modulated component and a phase modulated component, an amplitude signal serving as the amplitude modulated component and a pulse modulated signal based on the amplitude signal, outputs the amplitude signal and the pulse modulated signal, and outputs a transmission signal obtained by superposing the input signal on a carrier, a delay adjustment unit which is connected to the signal source control unit, and synchronizes the amplitude signal, pulse modulated signal, and transmission signal output from the signal source control unit with each other, a voltage signal generation unit which is connected to the delay adjustment unit, and outputs a voltage signal corresponding to the amplitude signal synchronized with the transmission signal, a current signal generation unit which is connected to the delay adjustment unit, and outputs a current signal corresponding to the pulse modulated signal synchronized with the transmission signal, and a transmission signal amplification unit which is connected to the delay adjustment unit, the voltage signal generation unit, and the current signal generation unit, amplifies the transmission signal, and outputs a transmission signal obtained by modulating an amplitude of the amplified transmission signal based on the voltage signal and the current signal.

(Supplementary note 2) A power amplifier according to Supplementary note 1 is characterized in that the delay adjustment unit includes a first delay circuit which adjusts a delay time of the amplitude signal, a second delay circuit which adjusts a delay time of the pulse modulated signal, a third delay circuit which adjusts a delay time of the transmission signal, and a delay control unit which determines the delay times to be adjusted by the first delay circuit, the second delay circuit, and the third delay circuit, and adjusts a synchronization timing between the transmission signal, the amplitude signal, and the pulse modulated signal.

(Supplementary note 3) A power amplifier according to Supplementary note 2 is characterized in that the delay control unit detects an error signal serving as an error component from a desired signal in an output signal of the transmission signal amplification unit, determines at least one delay time out of the delay times to be adjusted by the first delay circuit and the second delay circuit based on the error signal, and executes adjustment of the synchronization timing between the transmission signal, the amplitude signal, and the pulse modulated signal.

(Supplementary note 4) A power amplifier according to Supplementary note 2 is characterized in that the delay control unit detects a power consumption of the voltage signal generation unit, and executes at least one of adjustment of the delay time by the first delay circuit and adjustment of the delay time by the second delay circuit based on the power consumption.

(Supplementary note 5) A power amplifier according to Supplementary note 1 is characterized in that the signal source control unit includes a baseband signal processing unit which extracts the amplitude modulated component and the phase modulated component from an input baseband signal, an amplitude signal generation unit which generates an amplitude signal from the amplitude modulated component extracted by the baseband signal processing unit, and outputs the amplitude signal, a pulse signal generation unit which generates a pulse modulated signal obtained by pulse-modulating the amplitude modulated component extracted by the baseband signal processing unit, and outputs the pulse modulated signal, and a transmission signal generation unit which generates and outputs the transmission signal, the current signal generation unit includes a switching amplifier which amplifies the pulse modulated signal for which a delay control unit adjusts a synchronization timing, and a smoothing filter which smoothes an output signal of the switching amplifier and outputs a current signal, and the voltage signal generation unit includes a feedback amplifier.

(Supplementary note 6) A power amplifier according to Supplementary note 5 is characterized in that the pulse signal generation unit controls an operation of the switching amplifier in accordance with a supply current supplied to the transmission signal amplification unit based on the voltage signal and the current signal, and an output current of the switching amplifier, and outputs the pulse modulated signal.

(Supplementary note 7) A power amplifier according to Supplementary note 6 is characterized in that the switching amplifier includes a first switching element and second switching element which are series-connected between a direct-current power supply and a ground power supply, and an output terminal arranged at a connection point at which the first switching element and the second switching element are connected to each other at one terminal, and the first switching element and the second switching element perform control of a current output from the direct-current power supply to the output terminal and control of a current drawn from the output terminal to the ground power supply, and amplify the pulse modulated signal.

(Supplementary note 8) A power amplifier according to Supplementary note 6 is characterized in that the switching amplifier includes a transformer, a direct-current power supply terminal connected to one terminal of a primary coil of the transformer, a switching element connected to the other terminal of the primary coil of the transformer, a ground power supply terminal connected to one terminal of a secondary coil of the transformer, a first rectifier connected to the other terminal of the secondary coil of the transformer, and a second rectifier connected between the direct-current power supply and an output terminal of the first rectifier, the switching element is controlled by the pulse modulated signal to control a current flowing through the primary coil of the transformer from the direct-current power supply terminal and amplify the pulse modulated signal, and the amplified pulse modulated signal is output to an output terminal of the second rectifier via the transformer, the first rectifier, and the second rectifier.

(Supplementary note 9) A power amplifier according to Supplementary note 6 is characterized in that the switching amplifier includes a transformer, a first direct-current power supply terminal connected to one terminal of a primary coil of the transformer, a switching element connected to the other terminal of the primary coil of the transformer, a second power supply terminal connected to one terminal of a secondary coil of the transformer, a first rectifier connected to the other terminal of the secondary coil of the transformer, and a second rectifier connected between the second direct-current power supply and an output terminal of the first rectifier, the switching element is controlled by the pulse modulated signal to control a current flowing through the secondary coil of the transformer from the second direct-current power supply terminal and amplify the pulse modulated signal, and the amplified pulse modulated signal is output to an output terminal of the second rectifier via the transformer, the first rectifier, and the second rectifier.

(Supplementary note 10) A power amplifier according to Supplementary note 5 is characterized in that the smoothing filter is an inductor element and functions as a low-pass filter.

(Supplementary note 11) A power amplifier according to Supplementary note 5 is characterized in that the voltage signal generation unit includes a first voltage source which amplifies a low-frequency component of an amplitude signal for which the delay control unit adjusts a synchronization timing, and outputs a first voltage, a second voltage source which amplifies a high-frequency component of the amplitude signal for which the delay control unit adjusts the synchronization timing, and outputs a second voltage, a low-pass filter which is connected to an output terminal of the first voltage source and removes high-frequency noise of the first voltage source, and a high-pass filter which is connected to an output terminal of the second voltage source and removes low-frequency noise of the second voltage source, and an output voltage from the low-pass filter connected to the first voltage source and an output voltage from the high-pass filter connected to the second voltage source are synthesized and output.

(Supplementary note 12) A power amplifier according to Supplementary note 1 is characterized in that the amplitude modulated component of the transmission signal is extracted from the input signal by a polar modulator.

(Supplementary note 13) A power amplifier according to Supplementary note 1 is characterized in that the transmission signal is a signal obtained by superposing the phase modulated component of the input signal on a carrier.

(Supplementary note 14) A power amplification method is characterized by comprising the steps of receiving, as an input signal, a modulated signal containing an amplitude modulated component and a phase modulated component, amplifying the amplitude modulated component of the received modulated signal to output a voltage signal, amplifying the amplitude modulated component of the received modulated signal to output a current signal, synthesizing the voltage signal and the current signal to generate and output a modulated power supply signal, setting a synchronization delay amount between a signal obtained by superposing the modulated signal on a carrier and a voltage signal output from a voltage source, setting a synchronization delay amount between the signal obtained by superposing the modulated signal on a carrier and a current signal output from a current source, and amplifying the signal obtained by superposing the modulated signal on the carrier, and outputting a transmission signal obtained by modulating an amplitude of the amplified signal based on a modulated power supply signal.

(Supplementary note 15) A power amplification method according to Supplementary note 14 is characterized by further comprising the step of extracting the amplitude modulated component of the modulated signal by a polar modulator.

(Supplementary note 16) A power amplification method according to Supplementary note 14 is characterized by further comprising the step of amplifying a signal obtained by superposing the phase modulated component of the modulated signal on a carrier, modulating an amplitude of the amplified signal based on the modulated power supply signal, and outputting a transmission signal.

(Supplementary note 17) A recording medium allows a computer to read the steps of generating a modulated power supply signal by synthesizing a voltage signal obtained by amplifying an amplitude modulated component of a modulated signal containing an amplitude modulated component and a phase modulated component, and a current signal obtained by amplifying the amplitude modulated component of the modulated signal, and setting a synchronization delay amount between a signal obtained by superposing the modulated signal on a carrier and the voltage signal of the modulated power supply signal, and setting a synchronization delay amount between the signal obtained by superposing the modulated signal on the carrier and the current signal of the modulated power supply signal.

This application is based upon and claims the benefit of priority from Japanese patent application No. 2009-178849, filed on Jul. 31, 2009, the disclosure of which is incorporated herein in its entirety by reference.

Industrial Applicability

The present invention can be applied to a transmission power amplifier (PA) used in a wireless communication device.

Explanation of the Reference Numerals and Signs 100, 200, 300, 400, 500, 600, 700 . . . power amplifier, 110, 210 . . . signal source control unit, 120, 220, 320, 420 . . . delay adjustment unit, 130, 230, 730 . . . voltage signal generation unit, 140, 240, 540, 640 . . . current signal generation unit, 150, 250 . . . transmission signal amplification unit, 360 . . . transmission signal feedback unit

The invention claimed is:

1. A power amplifier comprising:
a signal source control unit which generates, from an input signal containing an amplitude modulated component and a phase modulated component, an amplitude signal serving as the amplitude modulated component and a pulse modulated signal based on the amplitude signal, outputs the amplitude signal and the pulse modulated signal, and outputs a transmission signal obtained by superposing the input signal on a carrier;
a delay adjustment unit which is connected to said signal source control unit, and synchronizes the amplitude signal, pulse modulated signal, and transmission signal output from said signal source control unit with each other;
a voltage signal generation unit which is connected to said delay adjustment unit, and outputs a voltage signal corresponding to the amplitude signal synchronized with the transmission signal;
a current signal generation unit which is connected to said delay adjustment unit, and outputs a current signal corresponding to the pulse modulated signal synchronized with the transmission signal; and
a transmission signal amplification unit which is connected to said delay adjustment unit, said voltage signal generation unit, and said current signal generation unit, amplifies the transmission signal, and outputs a transmission signal obtained by modulating an amplitude of the amplified transmission signal based on the voltage signal and the current signal.

2. A power amplifier according to claim 1, wherein said delay adjustment unit includes
  a first delay circuit which adjusts a delay time of the amplitude signal,
  a second delay circuit which adjusts a delay time of the pulse modulated signal,
  a third delay circuit which adjusts a delay time of the transmission signal, and
  a delay control unit which determines the delay times to be adjusted by said first delay circuit, said second delay circuit, and said third delay circuit, and adjusts a synchronization timing between the transmission signal, the amplitude signal, and the pulse modulated signal.

3. A power amplifier according to claim 2, wherein said delay control unit detects an error signal serving as an error component from a desired signal in an output signal of said transmission signal amplification unit, determines at least one delay time out of the delay times to be adjusted by said first delay circuit and said second delay circuit based on the error signal, and executes adjustment of the synchronization timing between the transmission signal, the amplitude signal, and the pulse modulated signal.

4. A power amplifier according to claim 2, wherein said delay control unit detects a power consumption of said voltage signal generation unit, and executes at least one of adjustment of the delay time by said first delay circuit and adjustment of the delay time by said second delay circuit based on the power consumption.

5. A power amplifier according to claim 1, wherein
  said signal source control unit includes
  a baseband signal processing unit which extracts the amplitude modulated component and the phase modulated component from an input baseband signal,
  an amplitude signal generation unit which generates an amplitude signal from the amplitude modulated component extracted by said baseband signal processing unit, and outputs the amplitude signal,
  a pulse signal generation unit which generates a pulse modulated signal obtained by pulse-modulating the amplitude modulated component extracted by said baseband signal processing unit, and outputs the pulse modulated signal, and
  a transmission signal generation unit which generates and outputs the transmission signal,
  said current signal generation unit includes
  a switching amplifier which amplifies the pulse modulated signal for which said delay control unit adjusts a synchronization timing, and
  a smoothing filter which smoothes an output signal of said switching amplifier and outputs a current signal, and
  said voltage signal generation unit includes a feedback amplifier.

6. A power amplifier according to claim 5, wherein said pulse signal generation unit controls an operation of said switching amplifier in accordance with a supply current supplied to said transmission signal amplification unit based on the voltage signal and the current signal, and an output current of said switching amplifier, and outputs the pulse modulated signal.

7. A power amplifier according to claim 6, wherein
  said switching amplifier includes
  a first switching element and second switching element which are series-connected between a direct-current power supply and a ground power supply, and
  an output terminal arranged at a connection point at which said first switching element and said second switching element are connected to each other at one terminal, and said first switching element and said second switching element perform control of a current output from the direct-current power supply to the output terminal and control of a current drawn from the output terminal to the ground power supply, and amplify the pulse modulated signal.

8. A power amplifier according to claim 6, wherein said switching amplifier includes
  a transformer,
  a direct-current power supply terminal connected to one terminal of a primary coil of said transformer,
  a switching element connected to the other terminal of the primary coil of said transformer,
  a ground power supply terminal connected to one terminal of a secondary coil of said transformer,
  a first rectifier connected to the other terminal of the secondary coil of said transformer, and
  a second rectifier connected between said direct-current power supply and an output terminal of said first rectifier,
  said switching element is controlled by the pulse modulated signal to control a current flowing through the primary coil of said transformer from said direct-current power supply terminal and amplify the pulse modulated signal, and the amplified pulse modulated signal is output to an output terminal of said second rectifier via said transformer, said first rectifier, and said second rectifier.

9. A power amplifier according to claim 6, wherein
  said switching amplifier includes
  a transformer,
  a first direct-current power supply terminal connected to one terminal of a primary coil of said transformer,
  a switching element connected to the other terminal of the primary coil of said transformer,
  a second power supply terminal connected to one terminal of a secondary coil of said transformer,
  a first rectifier connected to the other terminal of the secondary coil of said transformer, and
  a second rectifier connected between said second direct-current power supply and an output terminal of said first rectifier,
  said switching element is controlled by the pulse modulated signal to control a current flowing through the secondary coil of said transformer from said second direct-current power supply terminal and amplify the pulse modulated signal, and the amplified pulse modulated signal is output to an output terminal of said second rectifier via said transformer, said first rectifier, and said second rectifier.

10. A power amplifier according to claim 5, wherein said smoothing filter comprises an inductor element and functions as a low-pass filter.

11. A power amplifier according to claim 5, wherein
  said voltage signal generation unit includes
  a first voltage source which amplifies a low-frequency component of an amplitude signal for which the delay control unit adjusts a synchronization timing, and outputs a first voltage,
  a second voltage source which amplifies a high-frequency component of the amplitude signal for which the delay control unit adjusts the synchronization timing, and outputs a second voltage,
  a low-pass filter which is connected to an output terminal of said first voltage source and removes high-frequency noise of said first voltage source, and a high-pass filter which is connected to an output terminal of said second voltage source and removes low-frequency noise of said second voltage source, and an output voltage from said low-pass filter connected to said first voltage source and an output voltage from said high-pass filter connected to said second voltage source are synthesized and output.

12. A power amplifier according to claim 1, wherein the amplitude modulated component of the transmission signal is extracted from the input signal by a polar modulator.

13. A power amplifier according to claim 1, wherein the transmission signal comprises a signal obtained by superposing the phase modulated component of the input signal on a carrier.

14. A power amplification method comprising:
receiving, as an input signal, a modulated signal containing an amplitude modulated component and a phase modulated component;
amplifying the amplitude modulated component of the received modulated signal to output a voltage signal;
amplifying the amplitude modulated component of the received modulated signal to output a current signal;
synthesizing the voltage signal and the current signal to generate and output a modulated power supply signal;
setting a synchronization delay amount between a signal obtained by superposing the modulated signal on a carrier and a voltage signal output from a voltage source;
setting a synchronization delay amount between the signal obtained by superposing the modulated signal on a carrier and a current signal output from a current source; and
amplifying the signal obtained by superposing the modulated signal on the carrier, and outputting a transmission signal obtained by modulating an amplitude of the amplified signal based on the modulated power supply signal.

15. A power amplification method according to claim 14, further comprising extracting the amplitude modulated component of the modulated signal by a polar modulator.

16. A power amplification method according to claim 14, further comprising amplifying a signal obtained by superposing the phase modulated component of the modulated signal on a carrier, modulating an amplitude of the amplified signal based on the modulated power supply signal, and outputting a transmission signal.

17. A non-transitory computer-readablestorage medium storing a program causing a computer to execute:
generating a modulated power supply signal by synthesizing a voltage signal obtained by amplifying an amplitude modulated component of a modulated signal containing an amplitude modulated component and a phase modulated component, and a current signal obtained by amplifying the amplitude modulated component of the modulated signal, and setting a synchronization delay amount between a signal obtained by superposing the modulated signal on a carrier and the voltage signal of the modulated power supply signal; and
setting a synchronization delay amount between the signal obtained by superposing the modulated signal on the carrier and the current signal of the modulated power supply signal.

* * * * *